United States Patent
Kim et al.

(10) Patent No.: US 9,799,802 B2
(45) Date of Patent: Oct. 24, 2017

(54) LIGHT EMITTING MODULE

(71) Applicant: LG INNOTEK CO., LTD., Seoul (KR)

(72) Inventors: Ha Na Kim, Seoul (KR); Byung Mok Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/892,906

(22) PCT Filed: May 12, 2014

(86) PCT No.: PCT/KR2014/004217
§ 371 (c)(1),
(2) Date: Nov. 20, 2015

(87) PCT Pub. No.: WO2014/189221
PCT Pub. Date: Nov. 27, 2014

(65) Prior Publication Data
US 2016/0126426 A1    May 5, 2016

(30) Foreign Application Priority Data

May 23, 2013  (KR) .................. 10-2013-0058406
May 28, 2013  (KR) .................. 10-2013-0060080

(51) Int. Cl.
*H01L 33/48*    (2010.01)
*H01L 33/58*    (2010.01)
*H01L 33/50*    (2010.01)

(52) U.S. Cl.
CPC .......... *H01L 33/486* (2013.01); *H01L 33/502* (2013.01); *H01L 33/58* (2013.01)

(58) Field of Classification Search
CPC ...... H01L 33/486; H01L 33/502; H01L 33/58
See application file for complete search history.

(56) References Cited

U.S. PATENT DOCUMENTS 7,170,693 B2*  1/2007  Maeda .................. G11B 7/1372
                                                            359/811
7,307,391 B2* 12/2007  Shan ..................... B60Q 1/2611
                                                            315/291
(Continued)

FOREIGN PATENT DOCUMENTS

CN    101515053 A    8/2009
CN    102315361 A    1/2012
(Continued)

*Primary Examiner* — Ida M Soward
(74) *Attorney, Agent, or Firm* — Birch, Stewart, Kolasch & Birch, LLP

(57) ABSTRACT

An embodiment relates to a light emitting module. A light emitting module according to an embodiment includes a light source unit including a light emitting device; a body including a lower portion on which the light source unit is arranged, a wall portion arranged on the lower portion and configured to surround the light source unit, and an upper portion arranged on the wall portion; an optical member arranged on the light source unit to transmit light from the light emitting device; and an adhesive member arranged between the wall portion of the body and the optical member to couple the body and the optical member, wherein the upper portion of the body is arranged between the light emitting device and the adhesive member.

6 Claims, 13 Drawing Sheets

(56) References Cited

U.S. PATENT DOCUMENTS

| | | | | | |
|---|---|---|---|---|---|
| 8,220,973 | B2* | 7/2012 | Engl | ................ | H01L 33/483 362/317 |
| 8,652,357 | B2* | 2/2014 | Ryu | ................ | C09K 11/0883 252/301.4 F |
| 8,810,867 | B2* | 8/2014 | Sawada | ................ | H04N 1/0285 257/80 |
| 8,829,632 | B2* | 9/2014 | Fuse | ................ | H01L 27/14618 257/432 |
| 8,896,078 | B2* | 11/2014 | Kam | ................ | H01L 33/58 257/432 |
| 9,240,524 | B2* | 1/2016 | Park | ................ | H01L 33/486 |
| 9,261,252 | B2* | 2/2016 | Oh | ................ | H05K 1/05 |
| 9,274,359 | B2* | 3/2016 | Qian | ................ | G02F 1/133308 |
| 9,277,083 | B2* | 3/2016 | Sawada | ................ | H04N 1/0318 |
| 9,450,159 | B2* | 9/2016 | Jung | ................ | H01L 33/58 |
| 2005/0093129 | A1* | 5/2005 | Inoguchi | ................ | H01L 33/486 257/692 |
| 2005/0205876 | A1* | 9/2005 | Harada | ................ | H01L 33/44 257/79 |
| 2007/0284714 | A1* | 12/2007 | Sakakibara | ................ | H01L 23/055 257/680 |
| 2008/0001240 | A1* | 1/2008 | Minamio | ................ | H01L 27/14618 257/434 |
| 2008/0023711 | A1 | 1/2008 | Tarsa et al. | | |
| 2008/0315227 | A1 | 12/2008 | Bogner et al. | | |
| 2010/0072416 | A1* | 3/2010 | Fujioka | ................ | C08L 101/12 252/67 |
| 2011/0089449 | A1* | 4/2011 | Chou | ................ | H01L 33/486 257/98 |
| 2011/0092002 | A1* | 4/2011 | Tsai | ................ | H01L 33/486 438/26 |
| 2011/0255264 | A1* | 10/2011 | Tsutsumi | ................ | F21S 48/1159 362/84 |
| 2012/0012879 | A1* | 1/2012 | Loh | ................ | H01L 33/483 257/98 |
| 2013/0107535 | A1* | 5/2013 | Matsuwaki | ................ | F21V 29/004 362/260 |
| 2013/0181251 | A1* | 7/2013 | Higuchi | ................ | H01L 33/642 257/99 |
| 2014/0124822 | A1* | 5/2014 | Yan | ................ | H01L 33/641 257/99 |
| 2014/0226308 | A1* | 8/2014 | Fukuda | ................ | F21V 31/005 362/84 |
| 2014/0284650 | A1* | 9/2014 | Jung | ................ | H01L 33/58 257/98 |
| 2016/0111606 | A1* | 4/2016 | Park | ................ | H01L 33/486 257/98 |

FOREIGN PATENT DOCUMENTS

| | | |
|---|---|---|
| JP | 2007-250979 A | 9/2007 |
| JP | 2012-038999 A | 2/2012 |
| KR | 10-2005-0095180 A | 9/2005 |

* cited by examiner

LIGHT EMITTING MODULE

TECHNICAL FIELD

An embodiment relates to a light emitting module.

BACKGROUND ART

III group nitrides, such as gallium nitride (GaN), aluminum nitride (AlN), and indium gallium nitride (InGaN), are chiefly used in a light-emitting diode (LED) because they have excellent thermal stability and a directly shift energy band structure. Specifically, the III group nitrides are chiefly used in a blue LED and an ultraviolet LED (UV LED).

An UV LED which emits UV rays is packed in a specific body (or case), fabricated, and sold. In this case, the UV rays emitted by the UV LED may discolor or alter other parts including the body of a light emitting module. The discoloration or alteration of the body or other parts attributable to UV rays may have a bad effect on reliability or durability of a light emitting module including an UV LED.

DISCLOSURE

Technical Problem

A light emitting module according to an embodiment can prevent an adhesive member from being discolored or altered due to heat or UV rays of a light source unit.

A light emitting module according to an embodiment can prevent a phenomenon in which any metal unstable in first and second adhesive members adheres to the light-emitting surface of a light emitting device of a light source unit when a cover and a body are coupled by eutectic bonding.

Technical Solution

A light emitting module according to an embodiment includes a light source unit, a body, an optical member, and an adhesive member. The upper portion of the body is disposed between the light emitting device of the light source unit and the adhesive member. Such a light emitting module can prevent the adhesive member from being discolored or altered due to heat or UV rays of the light source unit.

A light emitting module according to an embodiment includes a light source unit, an optical member, a body, and an adhesive member. The body includes a first cavity in which the light source unit is disposed and a second cavity in which the optical member is disposed. The body includes a protrusion disposed in the second cavity. The protrusion is disposed between the light emitting device and the adhesive member. Such a light emitting module can prevent the adhesive member from being discolored or altered due to heat or UV rays of the light source unit.

A light emitting module according to an embodiment includes a light source unit, a body, an optical member, a cover, and an adhesive member. The upper portion of the body is disposed between the light emitting device of the light source unit and the adhesive member. Such a light emitting module can prevent the adhesive member from being discolored or altered due to heat or UV rays of the light source unit.

A light emitting module according to an embodiment includes a light source unit, a body, an optical member, a cover, and an adhesive member. The protrusion of the cover is disposed between the light emitting device of the light source unit and the adhesive member. Such a light emitting module can prevent the adhesive member from being discolored or altered due to heat or UV rays of the light source unit.

In the embodiments, the adhesive member may include a first adhesive member and a second adhesive member. The first adhesive member includes any one selected from the group consisting of gold (Au), nickel (Ni), titanium (Ti), copper (Cu), and chrome (Cr). If the second adhesive member includes any one selected from the group consisting of tin (Sn), germanium (Ge), silicon (Si), and antimony (Sb) and an alloy including gold (Au) or any one selected from the group consisting of lead (Pb) and silver (Ag) and an alloy including tin (Sn), in the embodiments, a phenomenon in which any metal unstable in the first and second adhesive members adheres to the light-emitting surface of a light emitting device of the light source unit can be prevented when the cover and the body are coupled by eutectic bonding.

Advantageous Effects

If the light emitting module according to an embodiment is used, there is an advantage in that the adhesive member can be prevented from being discolored or altered due to heat or UV rays of the light source unit.

If the light emitting module according to an embodiment is used, there is an advantage in that a phenomenon in which any metal unstable in the first and second adhesive members adheres to the light-emitting surface of a light emitting device of the light source unit can be prevented when the cover and the body are coupled by eutectic bonding.

MODE FOR INVENTION

Figure 1:
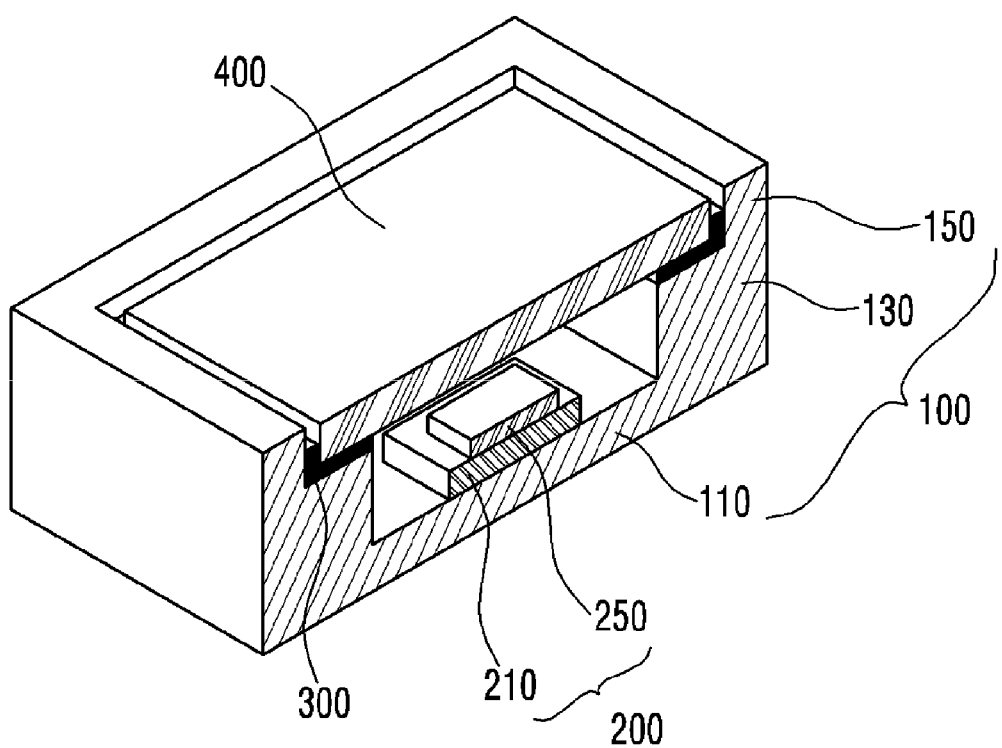
FIG. 1 is a cross-sectional perspective view of a light emitting module according to a first embodiment.

Hereinafter, embodiments of the present invention are described in detail with reference to the accompanying drawings. In this case, those skilled in the art may easily understand that the accompanying drawings are illustrated to disclose the contents of the present invention more easily and the scope of the present invention is not limited to the scope of the accompanying drawings.

Furthermore, a criterion for on or below (or over or under) each element is described on the basis of the drawings. Furthermore, in the drawings, the thickness or size of each layer has been enlarged, omitted, or schematically shown for convenience and clarity of description. Furthermore, an actual size is not entirely incorporated into the size of each element.

In a description of an embodiment of the present invention, if one element is said to be formed "on (over) or below (under)" the other element, the term on (over) or below (under) includes that the two elements have a direct come in contact with each other or one or more other elements are disposed between the two elements (indirectly). Furthermore, if "on (over) or below (under)" is expressed, it may include the meaning of an upward direction or a downward direction on the basis of one element.

Figure 2:
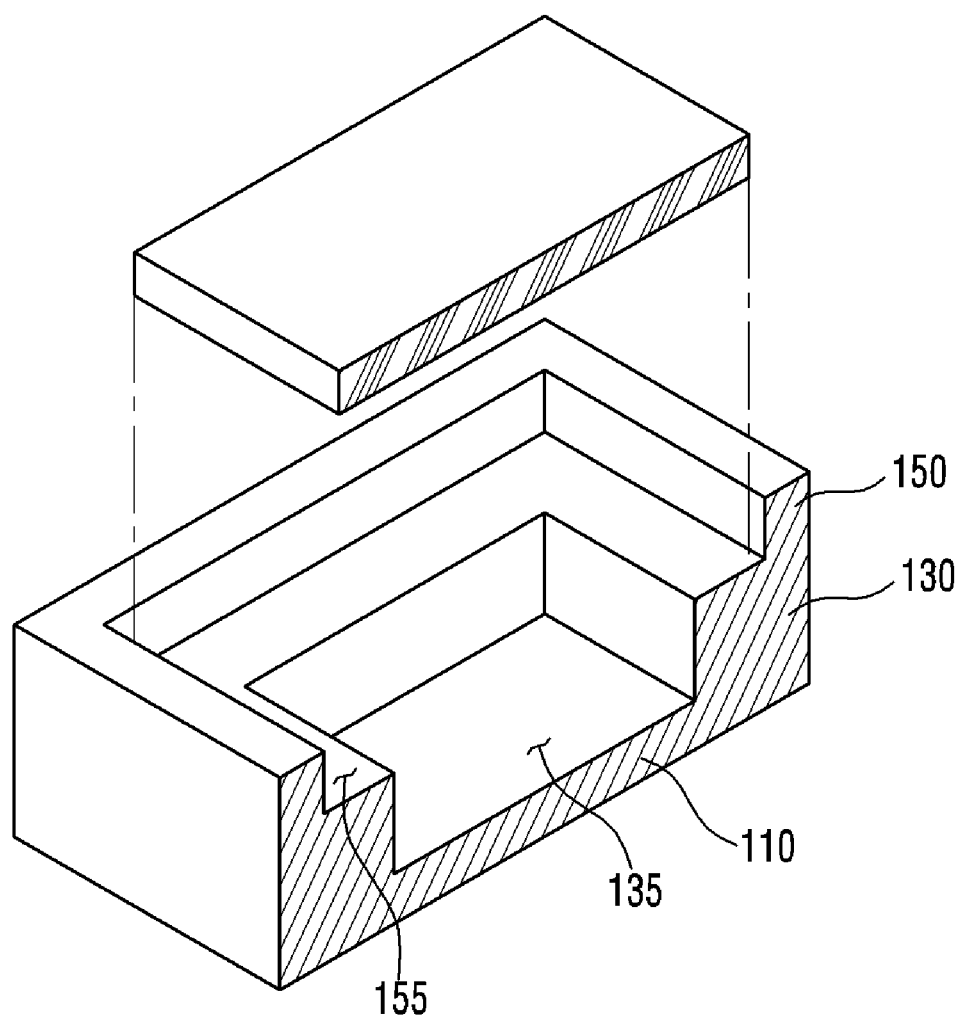
FIG. 2 is an exploded perspective view of the body and optical member of the light emitting module shown in FIG. 1.
Figure 3:
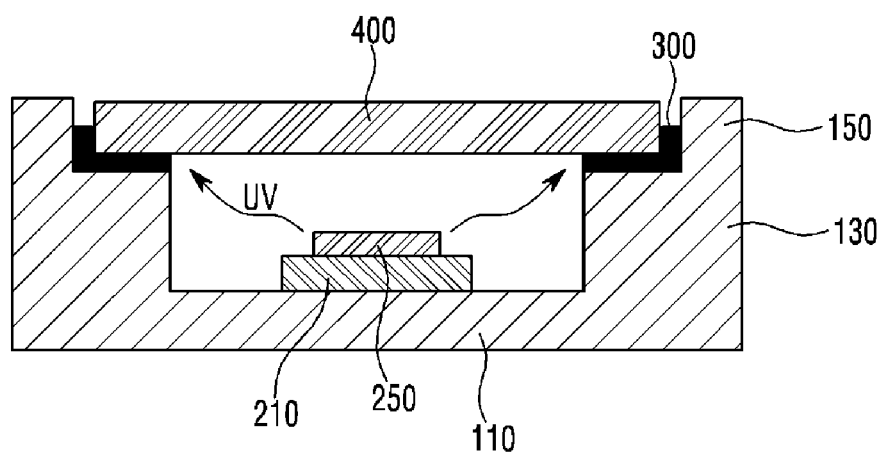
FIG. 3 is a cross-sectional view of the light emitting module shown in FIG. 1.

FIG. 1 is a cross-sectional perspective view of a light emitting module according to a first embodiment, FIG. 2 is an exploded perspective view of the body and optical member of the light emitting module shown in FIG. 1, and FIG. 3 is a cross-sectional view of the light emitting module shown in FIG. 1.

Referring to FIGS. 1 to 3, the light emitting module according to the first embodiment may include a body 100, a light source unit 200, an adhesive member 300, and an optical member 400.

The light source unit 200, the adhesive member 300, and the optical member 400 are disposed in the body 100. Specifically, the light source unit 200, the adhesive member 300, and the optical member 400 are received in the body 100. In this case, the body 100 is coupled to the optical member 400 through the adhesive member 300. The body 100 is described in more detail.

The body 100 may include a lower portion 110, a wall portion 130, and an upper portion 150. In this case, the lower portion 110, the wall portion 130, and the upper portion 150 may be made of the same material and integrally formed or may be made of the same or different materials, may be separately fabricated, and may be then coupled together.

The light source unit 200 and the wall portion 130 may be disposed on the lower portion 110. Specifically, the light source unit 200 and the wall portion 130 may be disposed on the top surface of the lower portion 110. In this case, the light source unit 200 may be disposed in the central part of the top surface of the lower portion 110. The wall portion 130 may be disposed in the outer part of the top surface of the lower portion 110 in such a way as to surround the surroundings of the light source unit 200.

The lower portion 110 may be a ceramic board of a single layer or a multi-layer. In this case, if the lower portion 110 is the ceramic board of a single layer, it may be implemented using a high temperature cofired ceramic (HTCC) technology. In this case, in the HTCC, ceramic layers may be formed by simultaneous firing at a high temperature of 1200° C. or higher.

If the lower portion 110 is the ceramic board of a multi-layer, for example, it may be formed by the HTCC or low temperature cofired ceramics (LTCC). If the lower portion 110 is the ceramic board of a multi-layer, the thickness of the layers may be the same or different, but is not limited thereto. If the lower portion 110 is made of an inorganic ceramic material, although a light source unit emitting deep UV rays or near UV rays having a wavelength of about 200~405 nm is used, reliability can be maintained without a possibility that the lower portion 110 may be discolored or altered due to the UV rays.

The lower portion 110 may be made of an insulating material, such as nitrides or oxides. For example, the lower portion 110 may include $SiO_2$, $Si_xO_y$, $Si_3N_y$, $SiO_xN_y$, $Al_2O_3$, or AlN.

A material capable of reflecting light is deposited or coated on the top surface of the lower portion 110, in particular, the central part of the top surface in which the light source unit 200 is disposed, thereby being capable of improving light extraction efficiency of the light emitting module according to the first embodiment.

The wall portion 130 may be disposed on the top surface of the lower portion 110. Specifically, the wall portion 130 may be disposed in the outer part of the top surface of the lower portion 110. The wall portion 130 may be spaced apart from the light source unit 200 at a predetermined interval and may be disposed to surround or besiege the surroundings of the light source unit 200. For example, the wall portion 130 may be disposed in the outer part of the top surface of the lower portion 110 in a shape, such as a circle or a polygon, in such a way as to surround or besiege the surroundings of the light source unit 200, and the shape is not limited thereto.

The wall portion 130 may include an outer wall exposed to the outside and inner walls surrounding the light source unit 200. The inner walls may be vertical to the top surface of the lower portion 110 and may form an obtuse angle or an acute angle with the top surface of the lower portion 110. The inner walls may be coated or deposited with a material capable of easily reflecting light emitted by the light source unit 200. The wall portion 130 including the inner walls having such a light reflection function may improve light extraction efficiency of the light emitting module according to the first embodiment.

Like the lower portion 110, the wall portion 130 may be a ceramic board including ceramic layers of a single layer or a multi-layer. In this case, if the wall portion 130 is the ceramic board of a multi-layer, the thickness of the layers may be the same or different, but is not limited thereto. If the wall portion 130 is made of an inorganic ceramic material, although a light source unit emitting deep UV rays or near UV rays having a wavelength of about 200~405 nm is used, reliability can be maintained without a possibility that the lower portion 130 may be discolored or altered due to the UV rays.

The light emitting module according to the first embodiment may include a first cavity 135 by the wall portion 130 and the lower portion 110. The first cavity 135 may be a space formed by the inner walls of the wall portion 130 and the top surface of the lower portion 110. The light source unit 200 may be disposed in the first cavity 135. Furthermore, the cavity 135 may be a vacuum state and may be filled with nitrogen (N2) gas or forming gas.

The upper portion 150 is disposed on the wall portion 130. Specifically, the upper portion 150 may be disposed on the top surface of the wall portion 130. The upper portion 150 may be disposed on the outer portion of the top surface of the wall portion 130.

The upper portion 150 guides the optical member 400. Specifically, the upper portion 150 may surround the sides of the optical member 400 and guide the optical member 400. In this case, the internal surfaces of the upper portion 150 may be spaced apart from the sides of the optical member 400 at a predetermined interval or may come in contact with the sides of the optical member 400. The upper portion 150 may have a shape, such as a circle or a polygon, depending on the shape of the wall portion 130, but is not limited thereto.

Like the lower portion 110 or the wall portion 130, the upper portion 150 may be a ceramic board including ceramic layers of a single layer or a multi-layer. In this case, if the wall portion 150 is the ceramic board of a multi-layer, the thickness of the layers may be the same or different, but is not limited thereto.

The light emitting module according to the first embodiment may include a second cavity 155 by the upper portion 150 and the wall portion 130. The second cavity 155 may be a space formed by the internal surfaces of the upper portion 150 and the top surface of the wall portion 130. The adhesive member 300 and the optical member 400 may be disposed in the second cavity 155. The second cavity 155 may be formed on the first cavity 135. The width of the second cavity 155 may be greater than that of the first cavity 135 in order to dispose the optical member 400 on the light source unit 200. Furthermore, the depth of the second cavity 155 may be smaller than that of the first cavity 135.

In the case of a ceramic board in which the body 100, that is, one or more of the lower portion 110, the wall portion 130, and the upper portion 150, are made of ceramic layers of a single layer or a multi-layer, although the light emitting device 250 of the light source unit 200 emits deep UV rays having a wavelength of about 200~405 nm, there is no possibility that the body 100 may be discolored or altered due to the UV rays. Accordingly, the light emitting module according to the first embodiment can secure reliability according to UV rays.

The light source unit 200 is disposed in the body 100. Specifically, the light source unit 200 may be disposed on the top surface of the lower portion 110 and may be disposed within the first cavity 135.

The light source unit 200 may include a board 210 and the light emitting device 250.

The board 210 may be a conductive board or an insulating board, and may include a material in which thermal conductivity and a coefficient of thermal expansion have been incorporated, such as Si, SiC, or AlN.

The board 210 may have a circuit pattern printed on an insulator, and may include a common printed circuit board (PCB), a metal core PCB, a flexible PCB, or a ceramic PCB, for example.

A surface of the board 210 may be made of a material which efficiently reflects light or may be coated with a color by which light is efficiently reflected, for example, white or silver.

The light emitting device 250 is an element emitting UV rays and may be a deep UV LED or a near UV LED using a semiconductor layer of 3 group-5 group elements, for example. Furthermore, the light emitting device 250 may be an LED emitting one or more of blue, green, red, and white.

The adhesive member 300 is an adhesive material which is interposed between the optical member 400 and the body 100 and couples the optical member 400 and the body 100.

The adhesive member 300 is disposed between the body 100 and the optical member 400. Specifically, the adhesive member 300 may be disposed on the top surface of the wall portion 130 and on the internal surfaces of the upper portion 150. When the optical member 400 is received in the second cavity 155 of the body 100, the adhesive member 300 may come in contact with part of the sides and bottom surface of the optical member 400.

The adhesive member 300 may be an organic material. The adhesive member 300 of an organic material may bond the body 100 and the optical member 400 more firmly if the body 100 is a ceramic board. In this case, the adhesive member 300 of an organic material may be cured through an UV curing process, thereby being capable of tightly fixing the body 100 and the optical member 400.

The optical member 400 transmits direct or indirect light emitted by the light source unit 200. The optical member 400 may simply transmit light from the light source unit 200 and may also diffuse or condense the light.

Furthermore, the optical member 400 may change the wavelength of light from the light source unit 200. To this end, the optical member 400 may include a wavelength conversion substance, such as a fluorescent substance.

The optical member 400 may be a light-transmitting material, for example, glass, polycarbonate (PC), or PMMA in order to transmit light from the light source unit 200.

The optical member 400 is disposed on the light source unit 200 and coupled to the body 100. Specifically, the optical member 400 may be disposed on the second cavity 155 formed on the first cavity 135 of the body 100 in which the light source unit 200 is disposed. Part of the sides and bottom surface of the optical member 400 may be bonded by the adhesive member 300, and thus the optical member 400 may be tightly coupled to the body 100. The sides of the optical member 400 may be surrounded by the upper portion 150 and may have a direct contact with the internal surfaces of the upper portion 150.

In the light emitting module according to the first embodiment, as shown in FIG. 3, the adhesive member 300 may be discolored or altered by heat emitted from the light emitting device 250 of the light source unit 200, or the adhesive member 300 of an organic material may be discolored or altered by deep UV rays emitted by the light emitting device 250 when the light emitting device 250 of the light source unit 200 emits UV rays, in particular, the deep UV rays. The discoloration or alteration of the adhesive member 300 may reduce coherence between the body 100 and the optical member 400. This may cause a severe problem which deteriorates durability and reliability of the light emitting module according to the first embodiment. A light emitting module capable of solving such a problem is described below with reference to FIGS. 4 to 6.

Figure 4:
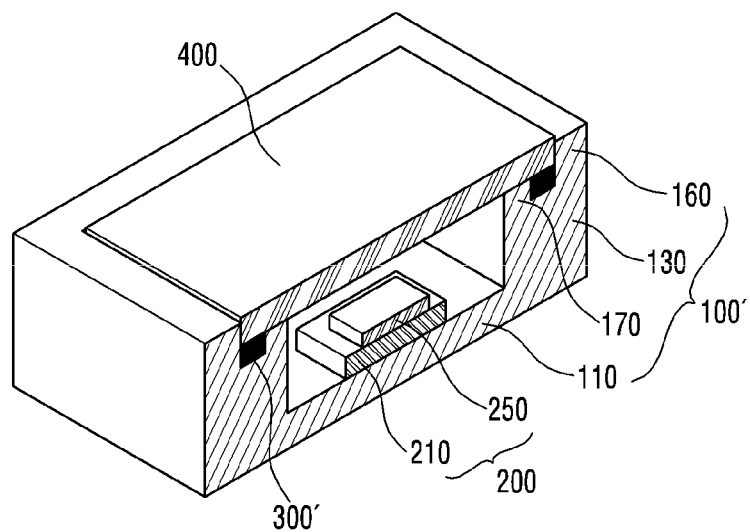
FIG. 4 is a cross-sectional perspective view of a light emitting module according to a second embodiment.
Figure 5:
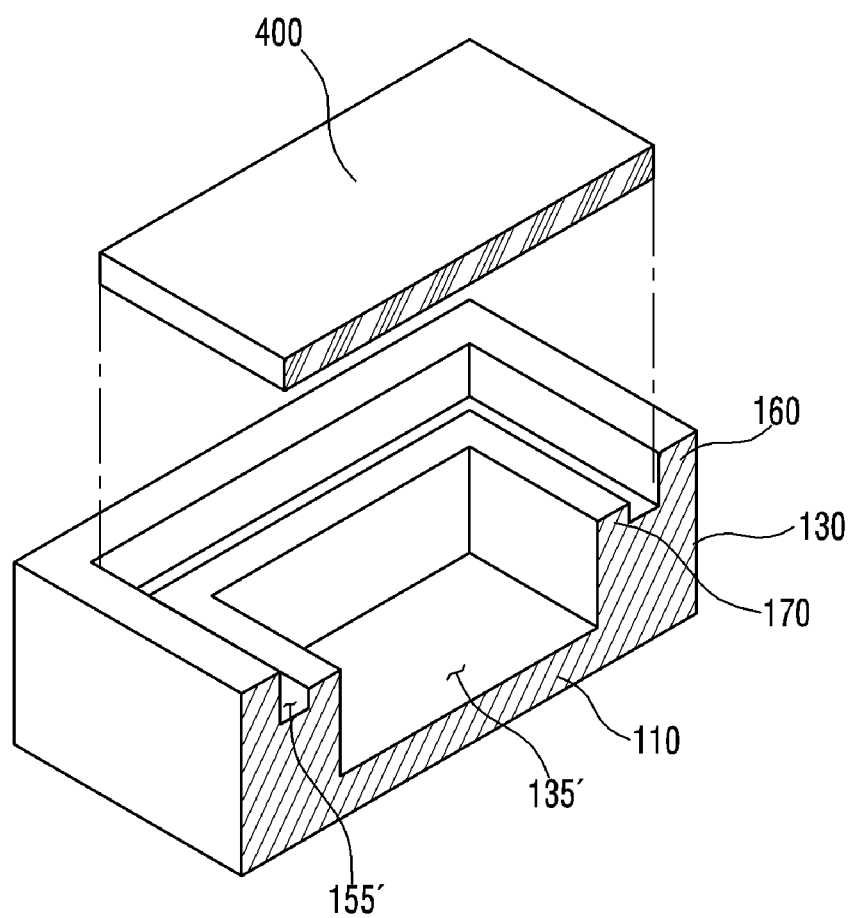
FIG. 5 is an exploded perspective view of the body and optical member of the light emitting module shown in FIG. 4.
Figure 6:
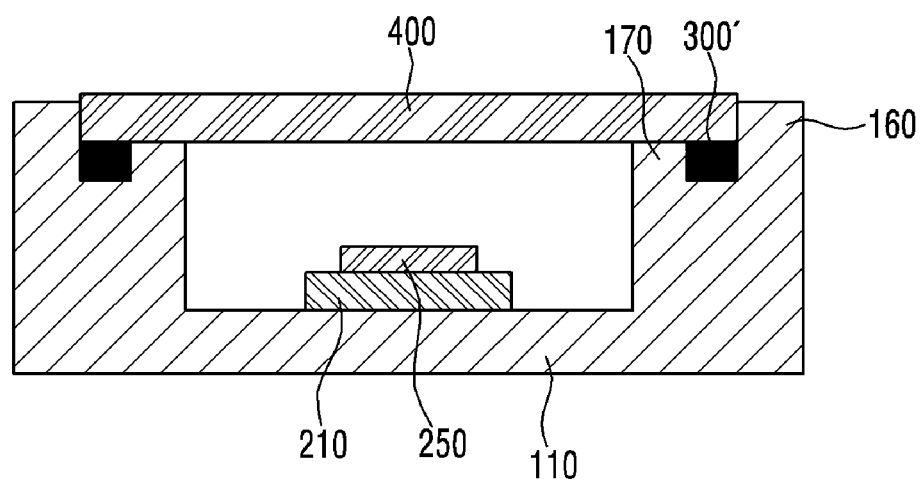
FIG. 6 is a cross-sectional view of the light emitting module shown in FIG. 4.

FIG. 4 is a cross-sectional perspective view of a light emitting module according to a second embodiment, FIG. 5 is an exploded perspective view of the body and optical member of the light emitting module shown in FIG. 4, and FIG. 6 is a cross-sectional view of the light emitting module shown in FIG. 4.

Referring to FIGS. 4 to 6, the light emitting module according to the second embodiment can prevent the discoloration or alteration of an adhesive member 300' attributable to heat or UV rays emitted by the light emitting device 250.

The light emitting module according to the second embodiment includes a body 100', a light source unit 200, the adhesive member 300', and an optical member 400.

In describing the light emitting module according to the second embodiment shown in FIGS. 4 to 6 below, the same elements as those of the light emitting module according to the first embodiment shown in FIGS. 1 to 3 are assigned the same reference numerals. Accordingly, a detailed description of the elements having the same reference numerals is substituted with the aforementioned contents.

The body 100' of the light emitting module according to the second embodiment includes a lower portion 110, a wall portion 130, and two or more upper portions 160 and 170. For convenience of description, reference numeral 160 is denoted as a first upper portion, and reference numeral 170 is denoted as a second upper portion. Prior to a description of the first upper portion 160 and the second upper portion 170, the top surface of the wall portion 130 is defined below. The top surface of the wall portion 130 may include an outer portion in which the first upper portion 160 is disposed, an inner portion in which the second upper portion 170 is disposed, and a middle portion in which the adhesive member 300' is disposed. In this case, the middle portion means a portion disposed between the outer portion and the inner portion.

The first upper portion 160 is disposed on the wall portion 130. Specifically, the first upper portion 160 may be disposed on the outer portion of the top surface of the wall portion 130

The first upper portion 160 may guide the optical member 400. Specifically, the first upper portion 160 may surround the sides of the optical member 400 and guide the optical member 160.

The first upper portion 160 may include external surfaces and internal surfaces. In this case, the internal surfaces may form a second cavity 155' along with the middle portion of the wall portion 130 and the external surfaces of the second upper portion 170.

The first upper portion 160 may come in contact with the optical member 400. Specifically, the sides of the optical member 400 may come in contact with the internal surfaces of the first upper portion 160. If the optical member 400 comes in contact with the first upper portion 160, the first upper portion 160 can guide the optical member 400 more tightly. Accordingly, since a specific gap is not formed between the optical member 400 and the first upper portion 160, a foreign substance or water can be prevented from entering the adhesive member 300'.

The second upper portion 170 is disposed on the wall portion 130. Specifically, the second upper portion 170 is disposed on the inner portion of the top surface of the wall portion 130. Furthermore, the second upper portion 170 is disposed between the light source unit 200 and the adhesive member 300'.

The second upper portion 170 may come in contact with the optical member 400. More specifically, the top surface of the second upper portion 170 may come in contact with the bottom surface of the optical member 400. When the second upper portion 170 comes in contact with the optical member 400, the second upper portion 170 can stably support the optical member 400.

Since the second upper portion 170 supports the optical member 400 and the first upper portion 160 tightly guides the optical member 400, the optical member 400 can be stably fixed to and installed in the body, and a reduction in the function of the adhesive member attributable to a foreign substance or water can be prevented.

The second upper portion 170 may include external surfaces and internal surfaces. In this case, the internal surfaces may form a first cavity 135' along with the top surface of the lower portion 110 and the inner walls of the wall portion 130. The external surfaces may form the second cavity 155' along with the middle portion of the wall portion 130 and the internal surfaces of the first upper portion 160.

The first cavity 135' is different from the first cavity 135 of the light emitting module according to the first embodiment. Specifically, the first cavity 135' is formed by the top surface of the lower portion 110, the inner walls of the wall portion 130, and the internal surfaces of the second upper portion 170. The light source unit 200 is disposed in the first cavity 135'.

The internal surfaces of the second upper portion 170 may prevent heat and UV rays which are emitted by the light source unit 200 and directed toward the adhesive member 300'. Accordingly, the discoloration or alteration of the adhesive member 300' attributable to heat and UV rays can be blocked.

Like the inner walls of the wall portion 130, the internal surfaces of the second upper portion 170 may be coated or deposited with a material capable of easily reflecting light from the light source unit 200.

Like the first upper portion 160, the second upper portion 170 may be a ceramic board including ceramic layers of a single layer or a multi-layer. Furthermore, the second upper portion 170 may have been integrated and formed with the lower portion 110, the wall portion 130, and the first upper portion 160.

The height of the second upper portion 170 may be smaller than that of the first upper portion 160. In this case, the height of the first upper portion 160 and the second upper portion 170 means a length from the top surface of the wall portion 130 to the top surface of each of the upper portions 160 and 170.

The first upper portion 160 and the second upper portion 170 may not come in contact with the optical member 400. This is described with reference to FIG. 7.

Figure 7:
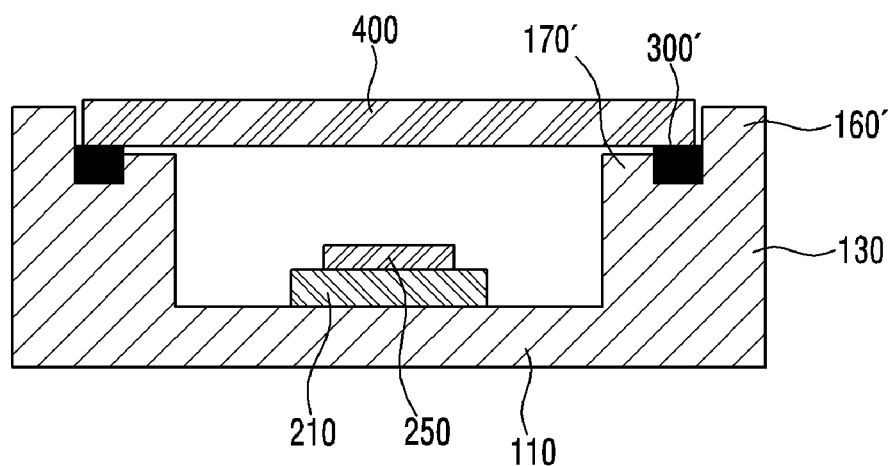
FIG. 7 is a light emitting module according to a third embodiment and shows a modified example of the light emitting module according to the second embodiment shown in FIG. 6.

FIG. 7 is a light emitting module according to a third embodiment and shows a modified example of the light emitting module according to the second embodiment shown in FIG. 6.

The light emitting module according to the third embodiment shown in FIG. 7 is different from the light emitting module according to the second embodiment shown in FIG. 6 in a first upper portion 160' and a second upper portion 170'. Specifically, referring to FIG. 7, the first upper portion 160' may be spaced apart from an optical member 400 at a predetermined interval. Specifically, the internal surfaces of the first upper portion 160' may be spaced apart from the sides of the optical member 400 at a predetermined interval.

Furthermore, the second upper portion 170' may be spaced apart from the optical member 400 at a predetermined interval. Specifically, the top surface of the second upper portion 170' may be spaced apart from the bottom surface of the optical member 400 at a predetermined interval.

In this case, the predetermined intervals may be narrow spaces which may be generated when the optical member 400 is installed a body 100'. However, the predetermined intervals are not essentially formed, and the predetermined intervals may not be formed if the optical member 400 is accurately fit into the body 100'.

In FIG. 7, both the first upper portion 160' and the second upper portion 170' have been illustrated as being spaced apart from the optical member 400 at a predetermined interval, but this is only an example. Any one of the first upper portion 160' and the second upper portion 170' may be spaced apart from the optical member 400 at a predetermined interval.

Referring to FIGS. 6 and 7, the height of the second upper portion 170 or 170' may be at least 50 μm or more. If the height of the second upper portion 170 or 170' is 50 μm or more and the second upper portion 170 or 170' is a ceramic board, there are advantageous effects in the manufacture process of the second upper portion 170 or 170'. Specifically, if the wall portion 130 is a ceramic board made of the same material as the second upper portion 170 or 170', a single ceramic layer for fabricating the second upper portion 170 or 170' can be additionally formed in a process of forming the ceramic wall portion 130 of a multi-layer structure without using a separate process for fabricating the second upper portion 170 or 170'. That is, the second upper portion 170 or 170' can be fabricated along with the wall portion 130. In this case, the height of 50 μm is a minimum thickness of a single ceramic layer which may be fabricated by a current process when a ceramic board of a multi-layer structure is formed. Accordingly, it is to be noted that the height may be further reduced with the development of the process of forming the ceramic layer.

The second upper portion 170 or 170' may be called a protrusion extended into the second cavity 155'. Accordingly, compared to the second cavity 155 of the light emitting module according to the first embodiment, the second cavity 155' may have a shape part of which has been removed by the protrusion 170.

In the light emitting modules according to the second to third embodiments, heat and UV rays emitted by the light emitting device 250 do not reach the adhesive member 300' due to the second upper portion 170 or 170'. Accordingly, the light emitting modules according to the second to third embodiments can further improve durability and reliability according to heat and UV rays because they can prevent the discoloration or/and alteration of the adhesive member 300' attributable to heat and UV rays.

Figure 8:
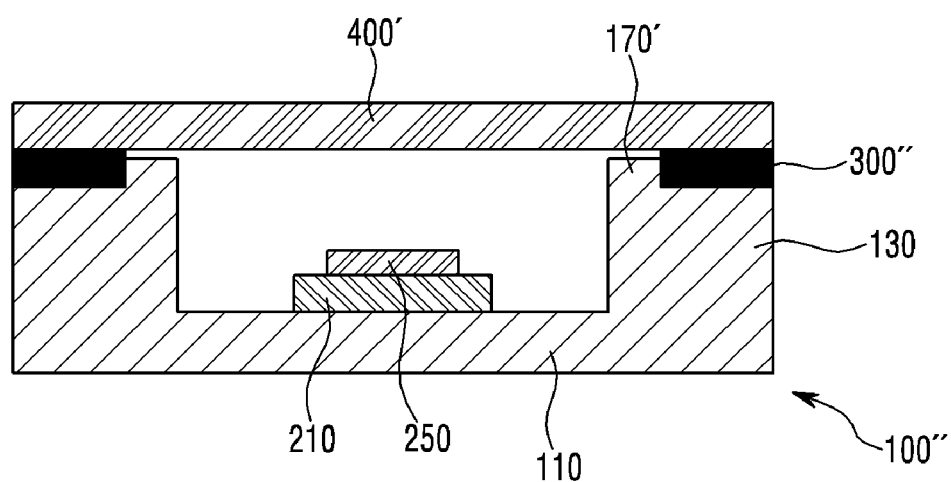
FIG. 8 is a light emitting module according to a fourth embodiment and shows a modified example of the light emitting module according to the second embodiment shown in FIG. 6.

FIG. 8 is a light emitting module according to a fourth embodiment and shows a modified example of the light emitting module according to the second embodiment shown in FIG. 6.

The light emitting module according to the fourth embodiment shown in FIG. 8 includes 1) a body 100" not having the first upper portion 160 and 2) an optical member 400' having a greater size than the optical member 400, compared to the light emitting module according to the second embodiment shown in FIG. 6.

The light emitting module according to the fourth embodiment shown in FIG. 8 is advantageous in that a light extraction area is further increased compared to the light emitting module according to the second embodiment shown in FIG. 6 because the sides of the optical member 400' are extended up to the outer wall of the wall portion 130 and is advantageous in that an additional process is not required because the first upper portion 160 shown in FIG. 6 does not need to be fabricated. Furthermore, since the first upper portion 160 is not present, the optical member 400' and the body 100" can be fixed more tightly because an adhesive member 300" can be used much more.

The upper portion 170' may be the same as the second upper portion 170' shown in FIG. 7. However, this is only an example, and the upper portion 170' may support the optical member 400' like the second upper portion 170 shown in FIG. 6. Specifically, the top surface of the upper portion 170' shown in FIG. 8 may come in contact with the bottom surface of the optical member 400'.

Like the light emitting module according to the second embodiment shown in FIG. 6, the light emitting module according to the fourth embodiment shown in FIG. 8 can further improve durability according to heat and UV rays because the discoloration or/and alteration of the adhesive member 300" attributable to heat and UV rays can be prevented.

Figure 9:
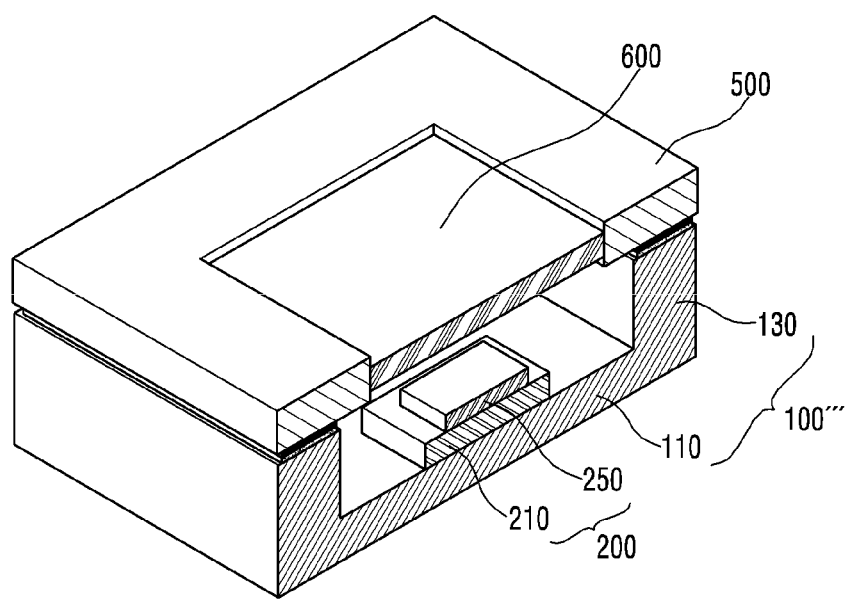
FIG. 9 is a cross-sectional perspective view of a light emitting module according to a fifth embodiment.
Figure 10:
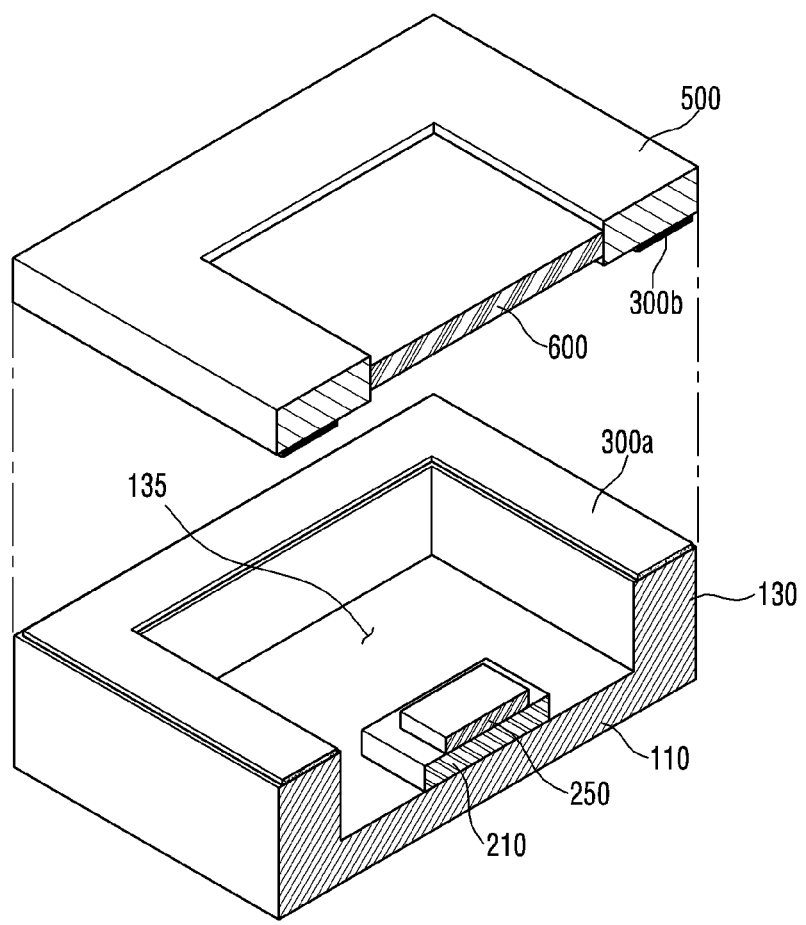
FIG. 10 is a perspective view showing that the body and cover of the light emitting module shown in FIG. 9 have been separated.
Figure 11:
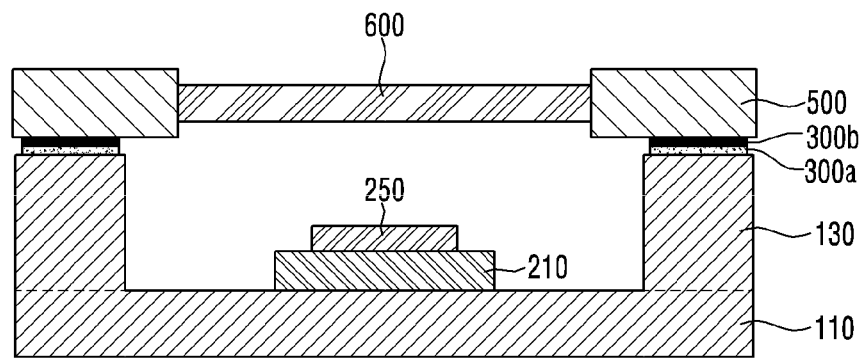
FIG. 11 is a cross-sectional view of the light emitting module shown in FIG. 9.

FIG. 9 is a cross-sectional perspective view of a light emitting module according to a fifth embodiment, FIG. 10 is a perspective view showing that the body and cover of the light emitting module shown in FIG. 9 have been separated, and FIG. 11 is a cross-sectional view of the light emitting module shown in FIG. 9.

Referring to FIGS. 9 to 11, the light emitting module according to the fifth embodiment may include a body 100''', a light source unit 200, a first adhesive member 300a, a second adhesive member 300b, a cover 500, and an optical member 600.

The light source unit 200, the first adhesive member 300a, the second adhesive member 300b, the cover 500, and the optical member 400 are disposed in the body 100'''. Specifically, the light source unit 200 is received in the body 100''', the body 100''' and the cover 500 are coupled through the first adhesive member 300a and the second adhesive member 300b, and the optical member 600 is coupled to the cover 500. The structure of the body 100''' is described in more detail.

The body 100''' may include a lower portion 110 and a wall portion 130. In this case, the lower portion 110 and the wall portion 130 are the same as the lower portion 110 and the wall portion 130 shown in FIGS. 1 to 8, and thus a description thereof is omitted.

The first adhesive member 300a and the second adhesive member 300b are adhesive materials which are disposed between the body 100 and the cover 500 and which couple the body 100 and the cover 500. More specifically, the first and the second adhesive members 300a and 300b may be substances for sealing the body 100 and the cover 500 by eutectic bonding.

The first adhesive member 300a is disposed in the top surface of the wall portion 130. In this case, the first adhesive member 300a may be disposed in the entire top surface of the wall portion 130 or may be disposed in part of the top surface of the wall portion 130.

The first adhesive member 300a may be metal or a substance including metal. For example, the first adhesive member 300a may include any one selected from the group consisting of gold (Au), nickel (Ni), titanium (Ti), copper (Cu), and chrome (Cr).

The second adhesive member 300b is disposed in the bottom surface of the cover 500 and disposed on the first adhesive member 300a. In this case, the second adhesive member 300b may be disposed in the entire bottom surface of the cover 500 or may be disposed in part of the bottom surface of the cover 500.

The second adhesive member 300b may be metal or an alloy having a melting point of 260° C. or more. Specifically, the second adhesive member 300b may be a single piece of metal including gold (Au). Furthermore, the second adhesive member 300b may be an alloy, including any one selected from the group consisting of tin (Sn), germanium (Ge), silicon (Si), and antimony (Sb) and gold (Au). Furthermore, the second adhesive member 300b may be an alloy, including any one selected from the group consisting of lead (Pb) and silver (Ag) and tin (Sn). The characteristics of the aforementioned metal or alloy which may be used as the second adhesive member 300b are described in detail as in <Table 1>.

optical member 600 may be disposed on the light emitting device 250 and may be disposed in the opening of the cover 500.

The optical member 600 transmits direct or indirect light emitted by the light source unit 200. The optical member 600 may simply transmit light from the light source unit 200 and may also diffuse or condense the light.

The optical member 600 may be formed of a transparent material and a non-reflecting coating film so that it externally transmits light generated by the light source unit 200 without absorbing the light. For example, the optical member 600 may be made of any one of a glass material, including $SiO_2$ (quartz, UV fused silica), $Al_2O_3$ (sapphire), LiF, $MgF_2$, $CaF_2$, low iron transparent glass, and B2O3, polycarbonate (PC), and PMMA.

TABLE 1

| Composition (wt %) | Melting Temperature | | Mechanical Properties | | | Physical Properties | | | |
| --- | --- | --- | --- | --- | --- | --- | --- | --- | --- |
| | Solidus Curve (° C.) | Liquidus Curve (° C.) | Tensile Strength (kg/mm$^2$) | Extension (%) | Hardness ($H_s$) | Thermal expansivity ($\times 10^{-6}$/° C.) | Electric conductivity (% LACS) | Thermal conductivity (W/m · K) | Specific gravity |
| Au | 1.063 | 1.063 | 13.3 | 45 | 25 | 14.2 | 75 | 311 | 19.3 |
| Au—20Sn | 280 | 280 | 29 | — | 118 | 17.5 | 7.7 | 57.3 | 14.52 |
| Au—90Sn | 217 | 217 | 6.7 | 2 | 16 | — | 11.2 | — | 7.78 |
| Au—12Ge | 356 | 356 | 19 | — | 108 | 12.0 | — | 44.4 | 14.67 |
| Au—7.4Ge | 356 | 680 | — | — | 82 | 13.1 | 7.1 | — | 16.16 |
| Au—3.15Si | 363 | 363 | — | — | 86 | 14.9 | — | — | 15.7 |
| Au—2Si | 363 | 760 | — | — | 65 | 13.9 | 15.8 | — | 16.85 |
| Pb—63Sn | 183 | 183 | 4.9 | — | 17 | 24.7 | 11.9 | 49 | 8.42 |
| Sn—3.5Ag | 221 | 221 | 2.0 | 73 | 40 | — | 14.0 | 33 | 7.36 |

The locations of the first adhesive member 300a and the second adhesive member 300b may be reversed. That is, the first adhesive member 300a may be disposed on the second adhesive member 300b.

If the first adhesive member 300a and the second adhesive member 300b are used, the body 100 and the cover 500 may be coupled by eutectic bonding. In accordance with such eutectic bonding, there is an advantage in that the body 100 and the cover 500 can be tightly coupled.

The cover 500 is disposed on the body 100''' and is coupled to the body 100''' through the first and the second adhesive members 300a and 300b.

The cover 500 does not transmit light emitted by the light source unit 200 and may include a separate opening which transmits the light. In this case, the opening may be formed in the central part of the cover 500, and the optical member 600 may be disposed in the opening.

The cover 500 is a metallic substance and may be a substance that is difficult to be discolored or altered by UV rays. For example, the cover 500 may be a single piece of metal including a metallic substance, such as iron (Fe) or nickel (Ni), or an alloy, including a metallic substance, such as iron (Fe) and nickel (Ni). For example, the cover 500 may be Kovar.

A substance capable of easily reflecting light emitted by the light emitting device 250 of the light source unit 200 may be deposited or coated on the cover 500. Specifically, a substance capable of easily reflecting light may be deposited or coated on the bottom surface of the cover 500 and an inner surface defining the opening.

The optical member 600 is disposed on the light source unit 200 and coupled to the cover 500. Specifically, the Furthermore, the optical member 600 may change the wavelength of light from the light source unit 200. To this end, the optical member 600 may include a wavelength conversion substance, such as a fluorescent substance.

When the body 100''' and cover 500 of the light emitting module according to the fifth embodiment are coupled by an eutectic bonding process under a specific pressure and temperature or less, if the second adhesive member 300b is an alloy including two pieces of metal, a phenomenon in which one piece of metal that belongs to the two pieces of metal and that is more unstable (e.g., metal that is evaporated and oxidized more easily) adheres to the light-emitting surface of the light emitting device 250 of the light source unit 200 (or a splattering phenomenon) may be generated. Such a phenomenon may deteriorate light extraction efficiency of the light emitting module because it reduces the light-emitting area of the light-emitting surface of the light emitting device 250. Accordingly, a light emitting module capable of solving such a problem is described below with reference to FIGS. 12 to 14.

Figure 12:
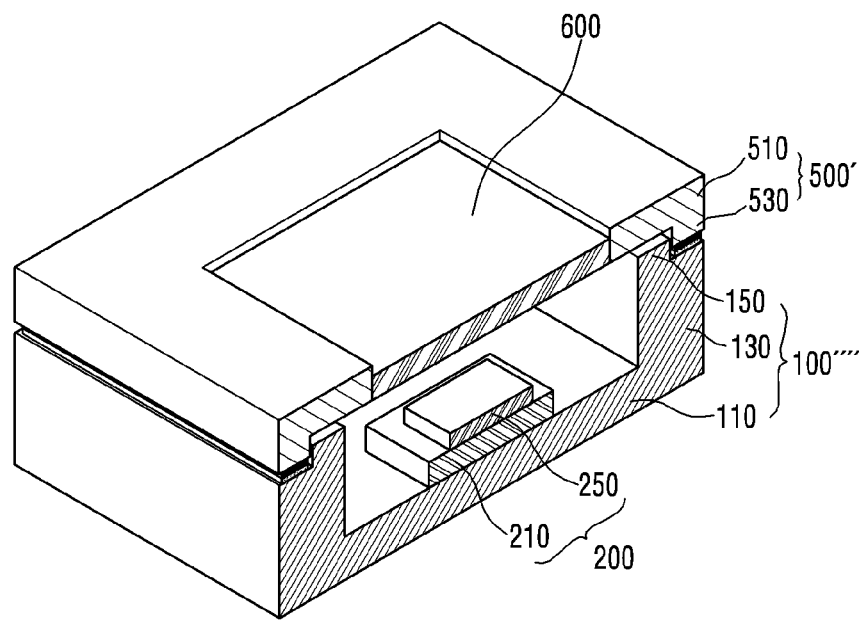
FIG. 12 is a cross-sectional perspective view of a light emitting module according to a sixth embodiment.
Figure 13:
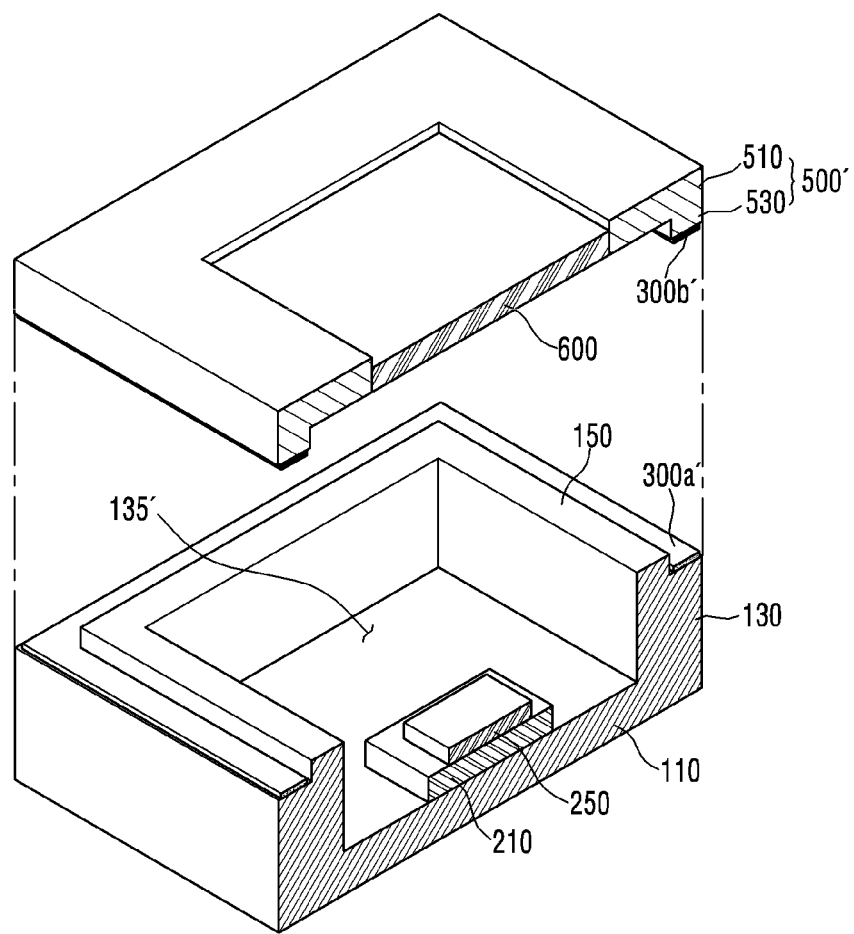
FIG. 13 is a perspective view showing that the body and cover of the light emitting module shown in FIG. 12 have been separated.
Figure 14:
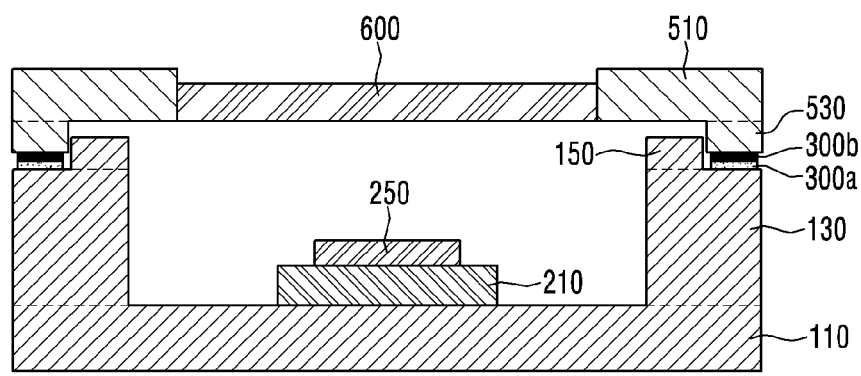
FIG. 14 is a cross-sectional view of the light emitting module shown in FIG. 12.

FIG. 12 is a cross-sectional perspective view of a light emitting module according to a sixth embodiment, FIG. 13 is a perspective view showing that the body and cover of the light emitting module shown in FIG. 12 have been separated, and FIG. 14 is a cross-sectional view of the light emitting module shown in FIG. 12.

Referring to FIGS. 12 to 14, the light emitting module according to the sixth embodiment can prevent a phenomenon in which one or more of pieces of metal forming a second adhesive member 300b adhere to the light emitting device 250.

The light emitting module according to the sixth embodiment includes a body 100'''', a light source unit 200, first and second adhesive members 300a and 300b, a cover 500', and an optical member 600.

In describing the light emitting module according to the sixth embodiment shown in FIGS. 12 to 14 below, the same elements as those of the light emitting module according to the fifth embodiment shown in FIGS. 9 to 12 are assigned the same reference numerals. Accordingly, a detailed description of the elements having the same reference numerals is substituted with the aforementioned contents.

The body 100"" of the light emitting module according to the sixth embodiment includes a lower portion 110, a wall portion 130, and an upper portion 150.

The upper portion 150 is disposed on the wall portion 130. Specifically, the upper portion 150 may be disposed in part of the top surface of the wall portion 130. The upper portion 150 may be disposed on the inner portion of the top surface of the wall portion 130. In this case, the top surface of the wall portion 130 may include the inner portion and the outer portion.

Furthermore, the upper portion 150 may have been upward protruded from the wall portion 130. For example, the upper portion 150 may be protruded from the wall portion 130 to the direction of the cover 500. The shape of the upper portion 150 may be a shape, such as a circle or a polygon, depending on the shape of the wall portion 130, but is not limited thereto.

Like the lower portion 110 or the wall portion 130, the upper portion 150 may be a ceramic board including ceramic layers of a single layer or a multi-layer. In this case, if the wall portion 150 is the ceramic board of a multi-layer, the thickness of the layers may be the same or different, but is not limited thereto.

The body 100"" may include a cavity 135'. The cavity 135' may be an empty space formed by the internal surfaces of the upper portion 150, the inner walls of the wall portion 130, and the top surface of the lower portion 110. The light source unit 200 may be disposed within the cavity 135'.

The cover 500' may include a cover portion 510 and a protrusion 530.

The cover portion 510 may have the same shape as the cover 500 shown in FIGS. 9 to 12.

The protrusion 530 may have been downward protruded or extended from the bottom surface of the cover portion 510. Specifically, the protrusion 530 may have been protruded or extended from the outer portion of the bottom surface of the cover portion 510 to the outer portion of the top surface of the wall portion 130.

The protrusion 530 of the cover 500' is disposed on the wall portion 130 of the body 100"" and disposed on the side of the upper portion 150 of the body 100"". Furthermore, the first and the second adhesive members 300a and 300b are disposed between the protrusion 530 of the cover 500' and the wall portion 130 of the body 100"".

The light emitting module according to the sixth embodiment can prevent one or more of pieces of metal, forming the second adhesive member 300b, from moving to the light emitting device 250 in advance when the body 100"" and the cover 500' are subject to eutectic bonding because the upper portion 150 of the body 100"" is disposed between the second adhesive member 300b and the light emitting device 250. Accordingly, the light emitting module according to the sixth embodiment has an advantage in that light extraction efficiency is not reduced by the second adhesive member 300b upon eutectic bonding. Furthermore, the light emitting module according to the sixth embodiment can prevent the discoloration or alteration of the first and the second adhesive members 300a and 300b because it can block heat and UV rays emitted by the light source unit 200.

The upper portion 150 may support the cover 500'. This is described with reference to FIG. 15.

Figure 15:
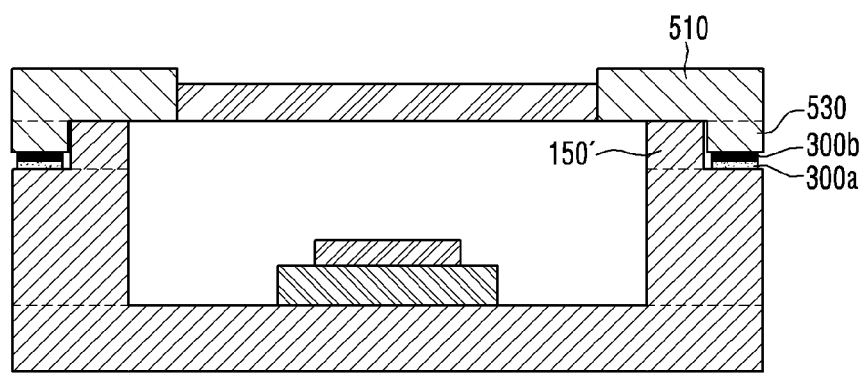
FIG. 15 is a light emitting module according to a seventh embodiment and shows a modified example of an upper portion 150 shown in FIG. 14.

FIG. 15 is a light emitting module according to a seventh embodiment and shows a modified example of the upper portion 150 shown in FIG. 14.

Unlike the upper portion 150 shown in FIG. 14, the upper portion 150' shown in FIG. 15 may support the cover 500'. Specifically, the top surface of the upper portion 150' may come in contact with the bottom surface of the cover portion 510 of the cover 500'. If the upper portion 150' supports the cover 500' as described above, the first and the second adhesive members 300a and 300b may have a previously designed height (thickness). This may be useful in cases, such as the following examples. For example, as shown in FIG. 14, if the upper portion 150 does not support the cover 500', when the cover 500' and the body 100"" are coupled, the protrusion 530 of the cover 500' may become very close to the wall portion 130 of the body 100"" by specific pressure applied to the cover 500'. In this case, part of the first and the second adhesive members 300a and 300b may overflow between the outer wall of the wall portion 130 and the outer wall of the protrusion 530 or the upper portion 150 and the cover portion 510 by the pressure. This may be the unnecessary waste of the first and the second adhesive members 300a and 300b, and the aforementioned problem may occur if part of the first and the second adhesive members 300a and 300b overflows between the upper portion 150 and the cover portion 510. Accordingly, if the upper portion 150' supports the cover 500' as shown in FIG. 15, the unnecessary waste of the first and the second adhesive members 300a and 300b can be eliminated, and the aforementioned problem can be prevented.

Furthermore, the light emitting module according to the seventh embodiment can prevent the discoloration or alteration of the first and the second adhesive members 300a and 300b because it can block heat and UV rays emitted by the light source unit 200.

In order to support the cover 500', the height of the upper portion 150' is greater than the height of the protrusion 530. More specifically, the height of the upper portion 150' may be the same as the sum of the height of the protrusion 530 and the height of the first and the second adhesive members 300a and 300b.

Figure 16:
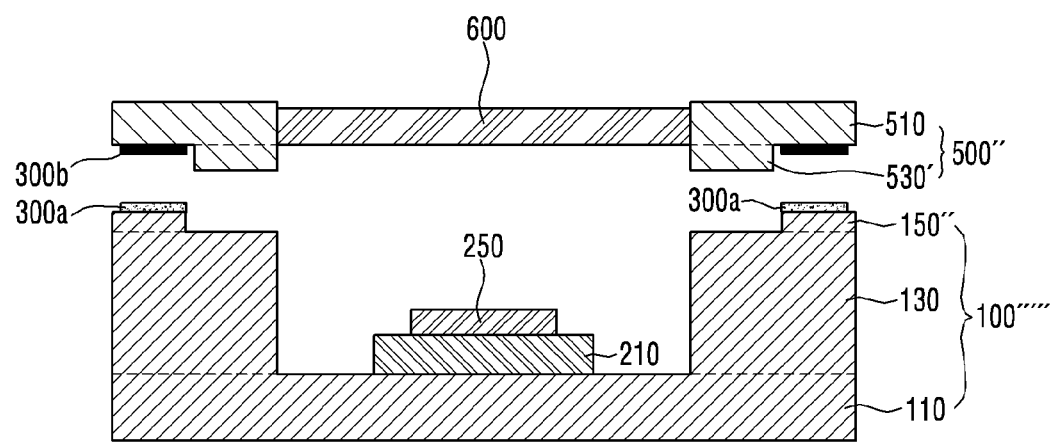
FIG. 16 is a light emitting module according to an eighth embodiment and shows a modified example of the light emitting module according to the sixth embodiment shown in FIG. 14.

FIG. 16 is a light emitting module according to an eighth embodiment and shows a modified example of the light emitting module according to the sixth embodiment shown in FIG. 14.

The light emitting module according to the eighth embodiment shown in FIG. 16 is different from the light emitting module according to the sixth embodiment shown in FIG. 14 in the location of the upper portion 150" of a body 100"" and the location of the protrusion 530' of a cover 500".

Specifically, the upper portion 150" of the body 100"" of the light emitting module according to the eighth embodiment shown in FIG. 16 is disposed on the outer portion of the top surface of a wall portion 130, and the protrusion 530' of the cover 500" is disposed on the inner portion of the bottom surface of a cover portion 510.

The protrusion 530' of the cover 500" is disposed on the wall portion 130 of the body 100"" and disposed on the side of the upper portion 150" of the body 100"". Furthermore, first and second adhesive members 300a and 300b are disposed between the upper portion 150" of the body 100"" and the cover portion 510 of the cover 500".

The light emitting module according to the eighth embodiment can prevent one or more of pieces of metal, forming the second adhesive member 300b, from moving to a light emitting device 250 in advance when the body 100'''' and the cover 500'' are subject to eutectic bonding because the protrusion 530' of the cover 500'' are disposed between the first and the second adhesive members 300a and 300b and the light emitting device 250. Accordingly, like the light emitting module according to the sixth embodiment, the light emitting module according to the eighth embodiment has an advantage in that light extraction efficiency is not reduced by the second adhesive member 300b upon eutectic bonding.

Furthermore, the light emitting module according to the eighth embodiment may prevent the discoloration or alteration of the first and the second adhesive members 300a and 300b because it can block heat and UV rays emitted by the light source unit 200.

The height of the protrusion 530' shown in FIG. 16 may be greater than that of the upper portion 150'' in order to prevent the unnecessary waste of the first and the second adhesive members 300a and 300b. More specifically, the height of the protrusion 530' may be the same as the sum of the height of the upper portion 150'' and the height of the first and the second adhesive members 300a and 300b.

Figure 17:
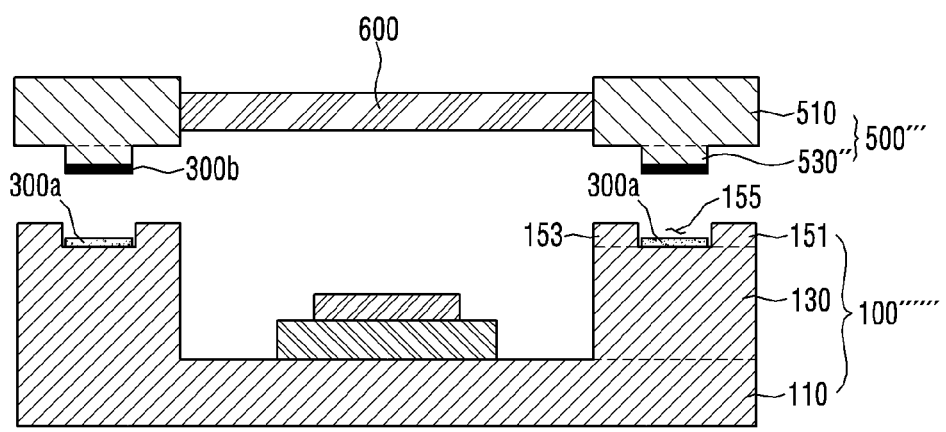
FIG. 17 is a light emitting module according to a ninth embodiment and shows a modified example of the light emitting module according to the sixth embodiment shown in FIG. 14.

FIG. 17 is a light emitting module according to a ninth embodiment and shows a modified example of the light emitting module according to the sixth embodiment shown in FIG. 14.

The light emitting module according to the ninth embodiment shown in FIG. 17 is different from the light emitting module according to the sixth embodiment shown in FIG. 14 in the upper portions 151 and 153 of a body 100''''' and the protrusion 530'' of a cover 500'''.

Specifically, the upper portions 151 and 153 of the body 100''''' of the light emitting module according to the ninth embodiment shown in FIG. 17 includes a first upper portion 151 and a second upper portion 153.

The first and the second upper portions 151 and 153 are disposed in the top surface of the wall portion 130. The first upper portion 151 and the second upper portion 153 are spaced apart from each other. The body 100''''' may include a groove 155 because the first upper portion 151 and the second upper portion 153 are spaced apart from each other. The first and the second upper portions 151 and 153 may have been upward protruded from the top surface of the wall portion 130.

The first upper portion 151 is disposed on the outer portion of the top surface of the wall portion 130, and the second upper portion 153 is disposed on the inner portion of the top surface of the wall portion 130.

The cover 500''' includes a cover portion 510 and the protrusion 530''. The protrusion 530'' may have been downward protruded from the middle portion of the bottom surface of the cover portion 510. In this case, the middle portion of the bottom surface of the cover portion 510 refers to a portion between the inner portion and outer portion of the bottom surface of the cover portion 510.

The protrusion 530'' is disposed between the first upper portion 151 of the body 100''''' and the second upper portion 153 of the body 100'''''. Furthermore, the protrusion 530'' may be disposed in the middle portion of the top surface of the wall portion 130 of the body 100'''''. In this case, the middle portion of the top surface of the wall portion 130 refers to a portion between the inner portion and outer portion of the top surface of the wall portion 130.

The first and the second adhesive members 300a and 300b are disposed between the protrusion 530'' of the cover 500''' and the first upper portion 151 and second upper portion 153 (or the groove 155) of the body 100'''''.

The light emitting module according to the ninth embodiment can prevent one or more of pieces of metal, forming the second adhesive member 300b, from moving to the light emitting device 250 in advance when the body 100''''' and the cover 500''' are subject to eutectic bonding because the second upper portion 153 of the body 100''''' is interposed between the first and the second adhesive members 300a and 300b and the light emitting device 250. Accordingly, like the light emitting module according to the sixth embodiment, the light emitting module according to the ninth embodiment has an advantage in that light extraction efficiency is not reduced by the second adhesive member 300b upon eutectic bonding. Furthermore, the light emitting module according to the ninth embodiment may prevent the discoloration or alteration of the first and the second adhesive members 300a and 300b because it can block heat and UV rays emitted by the light source unit 200. Furthermore, the light emitting module according to the ninth embodiment can prevent the alteration of the first and the second adhesive members 300a and 300b attributable to external dust or moisture because the first and the second adhesive members 300a and 300b are not exposed to the outside, unlike the light emitting modules according to the seventh and the eighth embodiments.

Meanwhile, the height of the first and the second upper portions 151 and 153 shown in FIG. 17 may be greater than that of the protrusion 530'' in order to prevent the unnecessary waste of the first and the second adhesive members 300 and 400 and to support the cover 500'''. More specifically, the height of the first and the second upper portions 151 and 153 may be the sum of the height of the protrusion 530'' and the height of the first and the second adhesive members 300a and 300b.

Meanwhile, each of the height of the upper portion 150, 150', or 150'' of the light emitting modules according to the sixth to eighth embodiments and the height of the upper portions 151 and 153 of the light emitting module according to the ninth embodiment may be at least 50 μm or more. If the height of the upper portion 150, 150', 150'', 151, or 153 is 50 μm or more and the upper portion 150, 150', 150'', 151, or 153 is a ceramic board, there are advantageous effects in a process of fabricating the upper portion 150, 150', 150'', 151, or 153. Specifically, if the wall portion 130 is a ceramic board that is the same material as the upper portion 150, 150', 150'', 151, or 153, a single ceramic layer for fabricating the upper portion 150, 150', 150'', 151, or 153 can be additionally formed in a process of forming the ceramic wall portion 130 of a multi-layer structure without using a separate process for fabricating the upper portion 150, 150', 150'', 151, or 153. That is, the upper portion 150, 150', 150'', 151, or 153 can be formed simultaneously with the wall portion 130 through a single process. In this case, the height of 50 μm is a minimum thickness of a single ceramic layer which may be fabricated by a current process when a ceramic board of a multi-layer structure is formed. Accordingly, it is to be noted that the height may be further reduced with the development of the process of forming the ceramic layer.

The embodiments have been chiefly described, but they are only examples. Those skilled in the art to which the present invention pertains may understand that various modifications and applications not described above are possible without departing from the essential characteristics of the present embodiment. For example, each of the elements described in the embodiments may be modified and implemented. Differences related to such modifications and applications should be construed as falling within the scope of the present invention defined by the appended claims.

The invention claimed is:

1. A light emitting module, comprising:
a light source unit comprising a light emitting device;
a body comprising a lower portion in which the light source unit is disposed, a wall portion disposed on the lower portion and surrounding the light source unit, and an upper portion including a top surface of the wall portion;
an optical member disposed on the light source unit and transmitting light from the light emitting device; and
an adhesive member disposed between the top surface of the wall portion of the body and the optical member,
wherein the upper portion of the body and the optical member come in contact with each other, or a gap between the upper portion of the body and the optical member is formed,
wherein the top surface of the wall portion of the body comprises an inner portion and an outer portion,
wherein a length between the inner portion of the top surface of the wall portion of the body and a bottom surface of the body is longer than that between the outer portion and the bottom surface of the body,
wherein the adhesive member is in contact with the outer portion of the top surface of the wall portion and the optical member,
wherein the light emitting device emits UV rays having a wavelength of 200 nm-405 nm, and
wherein a lateral side of the optical member is flush with an outer lateral side of the wall portion of the body.

2. The light emitting module of claim 1, wherein:
the optical member comprises a top surface and a bottom surface, and
the bottom surface of the optical member comes in contact with the inner portion of the top surface of the wall portion of the body.

3. The light emitting module of claim 1, wherein at least one of the lower portion, the wall portion, and the upper portion is a ceramic board comprising ceramic layers of a single layer or a multi-layer.

4. The light emitting module of claim 1, wherein:
the optical member comprises a top surface and a bottom surface, and
the bottom surface of the optical member is spaced apart from the inner portion of the top surface of the wall portion of the body at a predetermined interval.

5. The light emitting module of claim 1, wherein a length of a side of the optical member is equal to that of a side of the bottom surface of the body.

6. The light emitting module of claim 1, wherein a side of the adhesive member is disposed between a side of the optical member and a side of the wall portion of the body and is exposed to an outside.

* * * * *